United States Patent
Leobandung

(10) Patent No.: US 9,595,445 B2
(45) Date of Patent: Mar. 14, 2017

(54) FLOATING BODY STORAGE DEVICE EMPLOYING A CHARGE STORAGE TRENCH

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/131,614

(22) Filed: Apr. 18, 2016

(65) Prior Publication Data

US 2016/0233096 A1  Aug. 11, 2016

Related U.S. Application Data

(62) Division of application No. 14/243,037, filed on Apr. 2, 2014, now Pat. No. 9,318,492.

(51) Int. Cl.
*H01L 21/28* (2006.01)
*H01L 21/8234* (2006.01)
(Continued)

(52) U.S. Cl.
CPC .. *H01L 21/28282* (2013.01); *H01L 21/28273* (2013.01); *H01L 21/3081* (2013.01);
(Continued)

(58) Field of Classification Search
CPC ............. H01L 27/10802; H01L 29/785; H01L 29/7841; H01L 29/66795–29/66818; H01L 21/823431
See application file for complete search history.

(56) References Cited

U.S. PATENT DOCUMENTS 7,094,611 B1  8/2006 Hayashi
7,244,991 B2  7/2007 Ohsawa
(Continued)

OTHER PUBLICATIONS

Anchlia, A. et al., "Circuit Design for Bias Compatibility Investigation of Bulk FinFET Based Floating Body RAM" 2009 IEEE International Workshop on Memory Technology, Design, and Testing (Aug. 31, 2009-Sep. 2, 2009) pp. 7-12.
(Continued)

*Primary Examiner* — Erik Kielin
(74) *Attorney, Agent, or Firm* — Scully, Scott, Murphy & Presser, P.C.; Louis J. Percello, Esq.

(57) ABSTRACT

A charge storage trench structure is provided underneath a body region of a field effect transistor to store electrical charges in a region spaced from the p-n junctions between the body region and the source and drain regions of a field effect transistor. The charge storage trench structure can be embedded in a dielectric material layer, and a semiconductor fin can be formed by attaching a semiconductor material layer to the top surface of the charge storage trench structure and by patterning the semiconductor material layer. The field effect transistor is formed such that the charge storage trench structure contacts a bottom surface of the body region of the field effect transistor, while not contacting any of the source and drain regions. The electrical charges stored in the charge storage trench structure are physically spaced from the p-n junctions, and are less prone to leakage through the p-n junctions.

20 Claims, 11 Drawing Sheets

(51) Int. Cl.
*H01L 21/306* (2006.01)
*H01L 21/308* (2006.01)
*H01L 29/10* (2006.01)
*H01L 27/108* (2006.01)
*H01L 29/78* (2006.01)
*H01L 29/66* (2006.01)
*H01L 21/762* (2006.01)
*H01L 21/768* (2006.01)
*H01L 21/84* (2006.01)
*H01L 27/115* (2006.01)
*H01L 27/12* (2006.01)

(52) U.S. Cl.
CPC .. *H01L 21/30604* (2013.01); *H01L 21/30608* (2013.01); *H01L 21/768* (2013.01); *H01L 21/76224* (2013.01); *H01L 21/823431* (2013.01); *H01L 21/823475* (2013.01); *H01L 21/845* (2013.01); *H01L 27/10802* (2013.01); *H01L 27/10844* (2013.01); *H01L 27/11521* (2013.01); *H01L 27/1203* (2013.01); *H01L 29/1095* (2013.01); *H01L 29/66795* (2013.01); *H01L 29/785* (2013.01)

(56) References Cited

U.S. PATENT DOCUMENTS

| | | | |
|---|---|---|---|
| 7,433,242 B2 | 10/2008 | Ohsawa | |
| 7,452,758 B2 * | 11/2008 | Dyer | H01L 29/66795 257/E21.442 |
| 7,485,520 B2 * | 2/2009 | Zhu | H01L 29/66795 257/E21.301 |
| 7,595,532 B2 * | 9/2009 | Song | H01L 27/108 257/314 |
| 7,781,838 B2 | 8/2010 | Wu | |
| 7,880,231 B2 | 2/2011 | Chang | |
| 8,022,499 B2 | 9/2011 | Hwang | |
| 8,232,149 B2 | 7/2012 | Kim | |
| 8,233,312 B2 | 7/2012 | Xiao et al. | |
| 8,391,081 B2 | 3/2013 | Bawedin et al. | |
| 8,422,288 B2 | 4/2013 | Xiao et al. | |
| 8,927,966 B2 * | 1/2015 | Liu | H01L 21/84 257/24 |
| 2007/0158727 A1 | 7/2007 | Song et al. | |
| 2008/0224213 A1 * | 9/2008 | Dyer | H01L 29/785 257/347 |
| 2009/0008705 A1 * | 1/2009 | Zhu | H01L 29/66795 257/327 |
| 2009/0022003 A1 | 1/2009 | Song et al. | |
| 2009/0114991 A1 | 5/2009 | Kim et al. | |
| 2011/0199842 A1 | 8/2011 | Xiao et al. | |
| 2011/0292723 A1 | 12/2011 | Xiao et al. | |
| 2014/0054546 A1 | 2/2014 | Liu et al. | |
| 2015/0056801 A1 | 2/2015 | Park et al. | |

OTHER PUBLICATIONS

Hamamoto, T. et al., "Overview and Future Challenges of Floating Body RAM (FBRAM) Technology for 32nm Technology Node and Beyond" 38th European Solid-State Device Research Conference IEEE (Sep. 15-19, 2008) pp. 25-29.

* cited by examiner

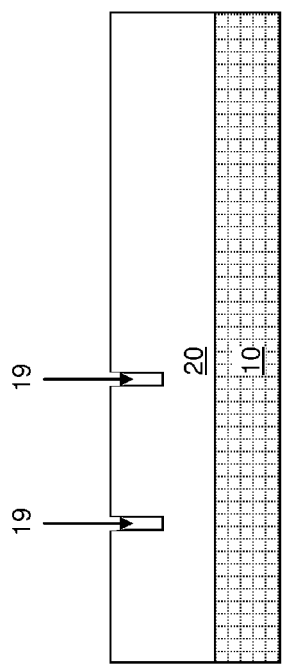
FIG. 1C
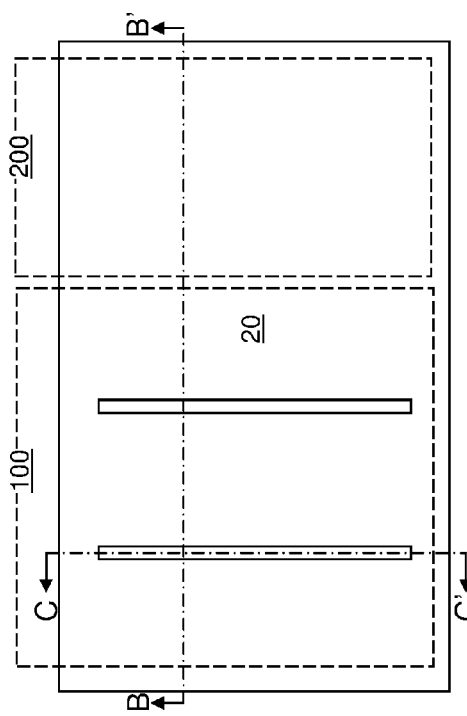
FIG. 1A
FIG. 1B

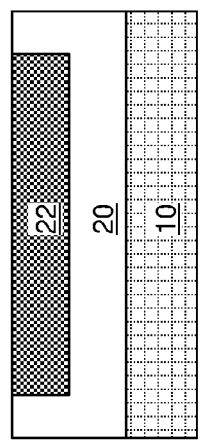
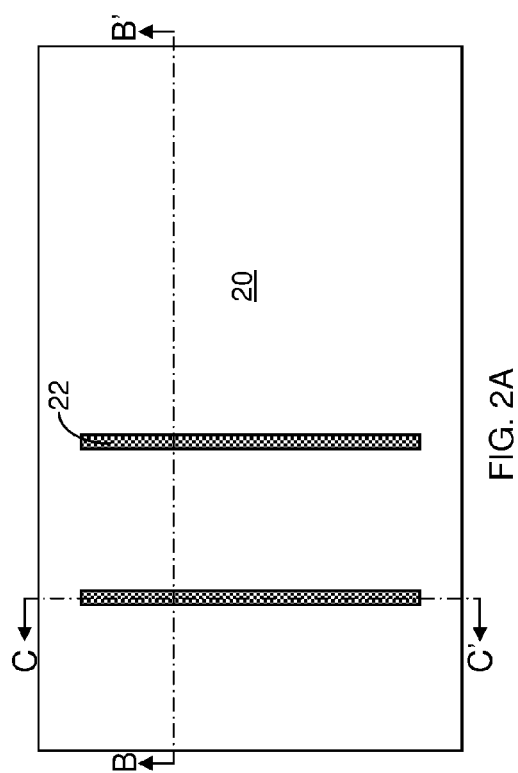
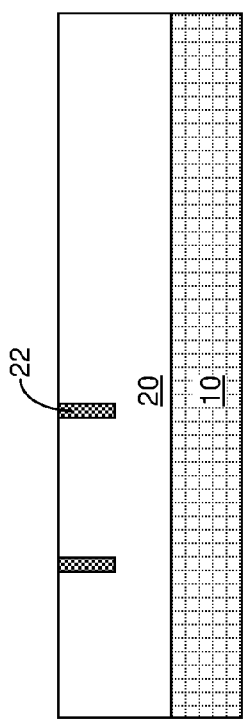

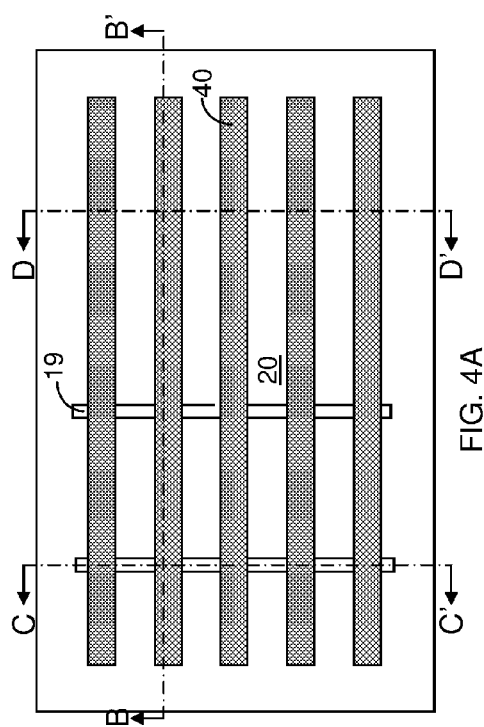
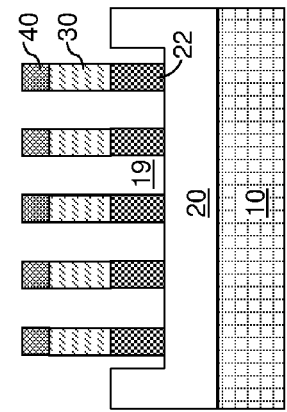
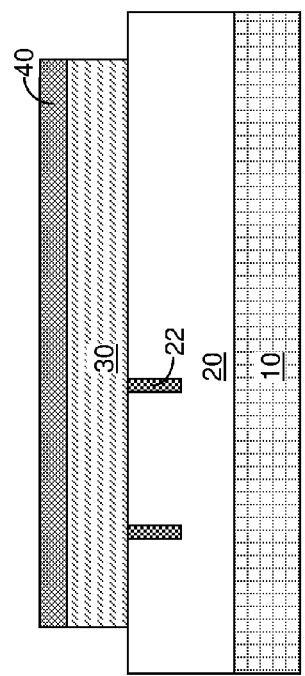
FIG. 4A
FIG. 4B
FIG. 4C
FIG. 4D

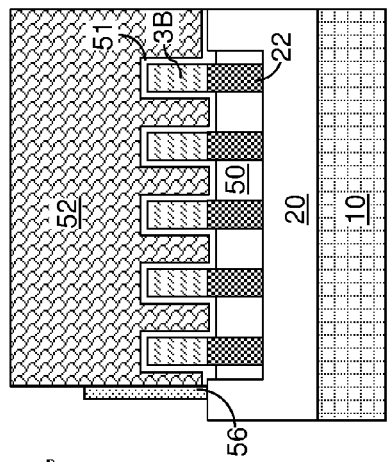
FIG. 9C
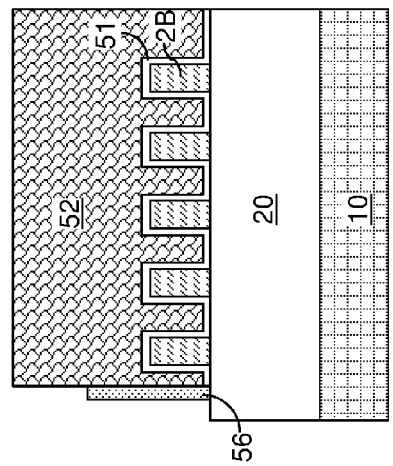
FIG. 9D
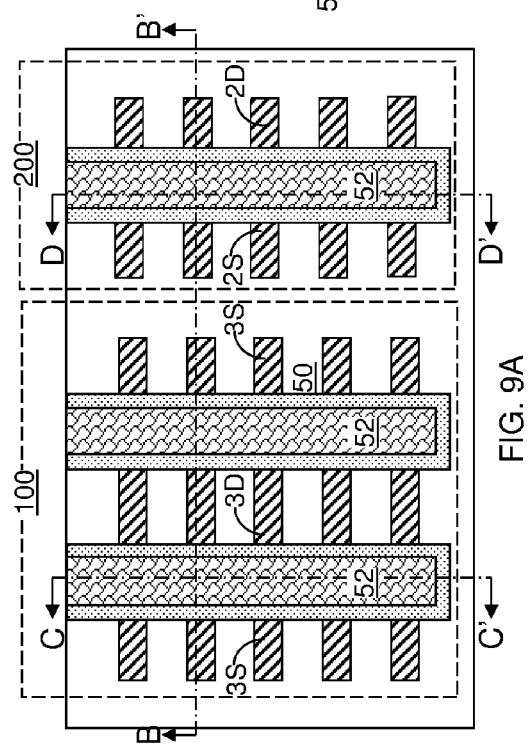
FIG. 9A
FIG. 9B
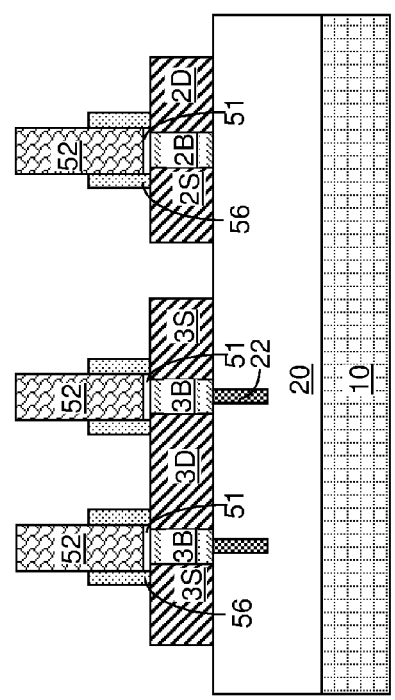

FLOATING BODY STORAGE DEVICE EMPLOYING A CHARGE STORAGE TRENCH

BACKGROUND

The present disclosure relates to a semiconductor device, and more specifically, a memory device employing a charge storage trench underlying a body region of a field effect transistor and a method manufacturing the same.

Trapped electrical charges in a body region of a field effect transistor alter the threshold voltage of the field effect transistor. Such a change in the threshold voltage in the field effect transistor can be detected by a sensing circuitry as known in the art to determine the charge state of the field effect transistor, i.e., the amount of electrical charges trapped in the body region of the field effect transistor. A challenge in such devices is the leakage current at the p-n junctions that are present between the body region and the source and drain regions of the field effect transistor. The greater the leakage current, the lesser the retention time for the trapped electrical charges, and consequently, the lesser the retention time for the stored information. Thus, a memory device with lesser leakage current through p-n junctions is desired.

SUMMARY

A charge storage trench structure is provided underneath a body region of a field effect transistor to enable storage of electrical charges in a region spaced from the p-n junctions between the body region and the source and drain regions of a field effect transistor. The charge storage trench structure can be embedded in a dielectric material layer, and a semiconductor fin can be formed by attaching a semiconductor material layer to the top surface of the charge storage trench structure and by patterning the semiconductor material layer. The field effect transistor is formed such that the charge storage trench structure contacts a bottom surface of the body region of the field effect transistor, while not contacting any of the source and drain regions. The electrical charges stored in the charge storage trench structure are physically spaced from the p-n junctions, and are less prone to leakage through the p-n junctions.

According to an aspect of the present disclosure, a semiconductor structure is provided, which includes a trench including a conductive material portion and embedded in a dielectric material layer, and a field effect transistor located on a top surface of the dielectric material layer. A top surface of the conductive material portion is in physical contact with a body region of the field effect transistor.

According to another aspect of the present disclosure, a method of forming a semiconductor structure is provided. A trench is formed in a dielectric material layer. The trench is filled with a conductive material. A field effect transistor is formed on a top surface of the dielectric material layer. A top surface of the conductive material portion is in physical contact with a body region of the field effect transistor.

BRIEF DESCRIPTION OF THE SEVERAL VIEWS OF THE DRAWINGS

FIG. 1A is a top-down view of an exemplary semiconductor structure after formation of trenches in an upper portion of a dielectric material layer according to an embodiment of the present disclosure.

FIG. 1B is a vertical cross-sectional view of the exemplary semiconductor structure along the vertical plane B-B' of FIG. 1A.

FIG. 1C is a vertical cross-sectional view of the exemplary semiconductor structure along the vertical plane C-C' of FIG. 1A.

FIG. 2A is a top-down view of the exemplary semiconductor structure after filling the trenches with a conductive material according to an embodiment of the present disclosure.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane C-C' of FIG. 2A.

FIG. 4A is a top-down view of the exemplary semiconductor structure after patterning the semiconductor material layer into semiconductor fins and removing physically exposed portions of a trench fill material by an anisotropic etch according to an embodiment of the present disclosure.

FIG. 4B is a vertical cross-sectional view of the exemplary semiconductor structure along the vertical plane B-B' of FIG. 4A.

FIG. 4C is a vertical cross-sectional view of the exemplary semiconductor structure along the vertical plane C-C' of FIG. 4A.

FIG. 4D is a vertical cross-sectional view of the exemplary semiconductor structure along the vertical plane D-D' of FIG. 4A.

FIG. 9A is a top-down view of the exemplary semiconductor structure after formation of source and drain regions and gate spacers according to an embodiment of the present disclosure.

FIG. 9B is a vertical cross-sectional view of the exemplary semiconductor structure along the vertical plane B-B' of FIG. 9A.

FIG. 9C is a vertical cross-sectional view of the exemplary semiconductor structure along the vertical plane C-C' of FIG. 9A.

FIG. 9D is a vertical cross-sectional view of the exemplary semiconductor structure along the vertical plane D-D' of FIG. 9A.

DETAILED DESCRIPTION

Figure 3C:
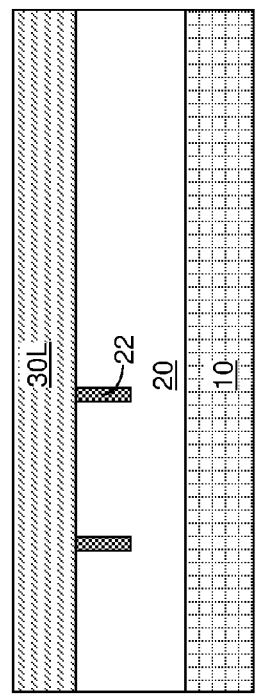
FIG. 3C is a vertical cross-sectional view of the exemplary semiconductor structure along the vertical plane C-C' of FIG. 3A.

As stated above, the present disclosure relates to a flash memory device employing a pair of semiconductor fins and a self-aligned floating gate electrode and a method manufacturing the same, which are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Referring to FIGS. 1A-1C, an exemplary semiconductor structure according to an embodiment of the present disclosure includes a substrate 10 and a dielectric material layer 20 formed on the top surface of the substrate 10. The substrate 10 can be a semiconductor substrate, an insulator substrate, a conductive substrate, or a combination thereof. The substrate 10 provides mechanical support to the dielectric material layer 20 and additional structures to be subsequently formed thereupon.

The dielectric material layer 20 can be formed as a blanket material layer having a same thickness throughout. The dielectric material layer 20 includes a dielectric material such as silicon oxide, sapphire, and/or silicon nitride. The dielectric material layer 20 can be deposited by a deposition method such as chemical vapor deposition (CVD) or spin-coating, or can be bonded to the substrate 10 employing methods known in the art. The thickness of the dielectric material layer 20 can be in a range from 30 nm to 600 nm, although lesser and greater thicknesses can also be employed. In one embodiment, the dielectric material layer 20 may have the same composition throughout the entirety thereof.

Trenches 19 are formed in the upper portion of the dielectric material layer 20. In one embodiment, the bottom surface of each trench 19 can be vertically spaced from, and located above, the top surface of the substrate 10. In another embodiment, at least a top portion of the substrate 10 can include an insulator material and the bottom surface of each trench 19 can extend to the top surface of the substrate 10.

In one embodiment, the trenches 19 can be line trenches extending along a same lateral direction. As used herein, a "line trench" refers to a trench including a pair of sidewalls that are parallel to each other and extending along a lateral direction parallel to the sidewalls. The horizontal direction along which the line trench extends is herein referred to as a lengthwise direction of the line trench. The horizontal direction that is perpendicular to the lengthwise direction of a line trench is herein referred to as a widthwise direction of the line trench. Thus, a line trench includes a portion having a uniform width, i.e., a width that is invariant under a lateral translation along the lengthwise direction of the line trench. The sidewalls that extend along the lengthwise direction of a line trench are herein referred to lengthwise sidewalls of the line trench.

The width of the trenches 19, as measured along the widthwise direction can be in a range from 10 nm to 100 nm, although lesser and greater widths can also be employed. The lateral length of the trenches 19, i.e., the lateral dimension of the lengthwise sidewalls of the trenches 19, can be in a range from 100 nm to 10,000 nm, although lesser and greater lateral lengths can also be employed. In one embodiment, the lengthwise directions of the trenches 19 can be the same and the spacing between each neighboring pair of the trenches 19 can be the same so that the trenches 19 form a one-dimensional array or a two-dimensional array. In one embodiment, the exemplary semiconductor structure can include a first device region 100 in which the trenches 19 are present, and a second device region 200 in which the trenches 19 are not present. In one embodiment, the first device region 100 can be employed to form memory devices, and the second device region 200 can be employed to form logic devices as known in the art.

Referring to FIGS. 2A-2C, the trenches 19 are filled with a conductive material to form conductive material portions 22. Specifically, the conductive material is deposited in the trenches 19 and on the top surface of the dielectric material layer 20 by a conformal deposition such that all trenches 19 are filled with the conductive material. The conductive material can be deposited, for example, by chemical vapor deposition. The conductive material is subsequently removed from above the top surface of the dielectric material layer 20 by a planarization process, which can be a recess etch, chemical mechanical planarization (CMP), or a combination thereof.

The conductive material can be, for example, a doped or undoped semiconductor material and/or a metallic material. Examples of the doped semiconductor material include, but are not limited to, doped polysilicon, doped amorphous silicon, a doped polycrystalline or amorphous silicon-containing semiconductor material, a doped polycrystalline or amorphous germanium-containing material, a doped compound semiconductor material, and combinations thereof. Examples of the metallic material include, but are not limited to, conductive metallic nitrides and conductive metallic carbides.

Figure 3A:
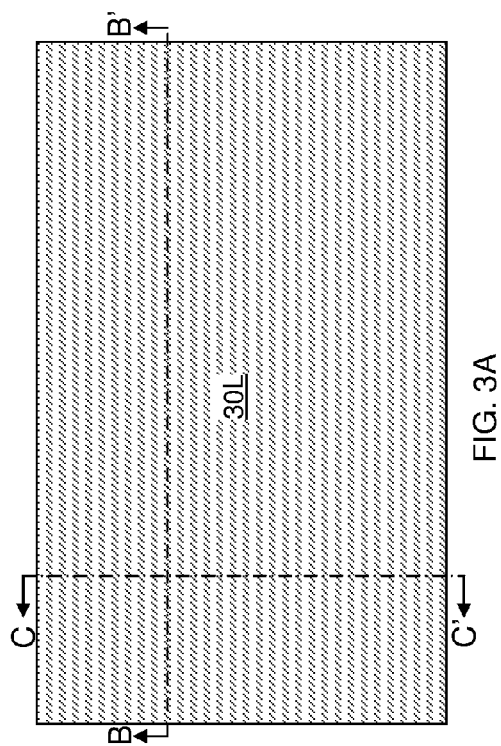
FIG. 3A is a top-down view of the exemplary semiconductor structure after bonding a semiconductor material layer according to an embodiment of the present disclosure.
Figure 3B:
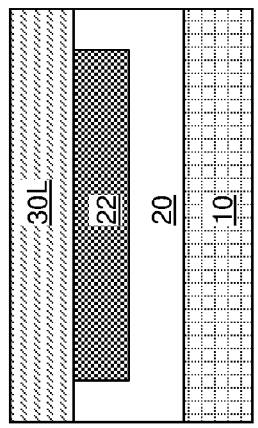
FIG. 3B is a vertical cross-sectional view of the exemplary semiconductor structure along the vertical plane B-B' of FIG. 3A.
Figure 5A:
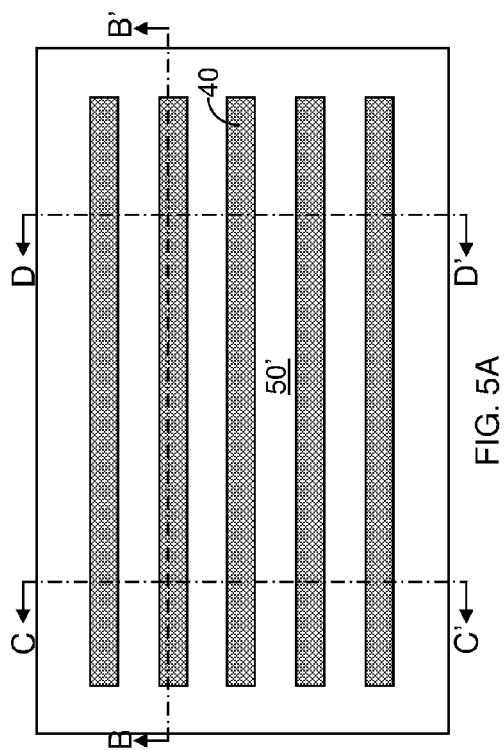
FIG. 5A is a top-down view of the exemplary semiconductor structure after formation of a planarization dielectric layer according to an embodiment of the present disclosure.
Figure 5C:
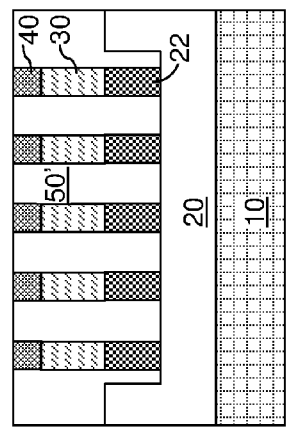
FIG. 5C is a vertical cross-sectional view of the exemplary semiconductor structure along the vertical plane C-C' of FIG. 5A.
Figure 5B:
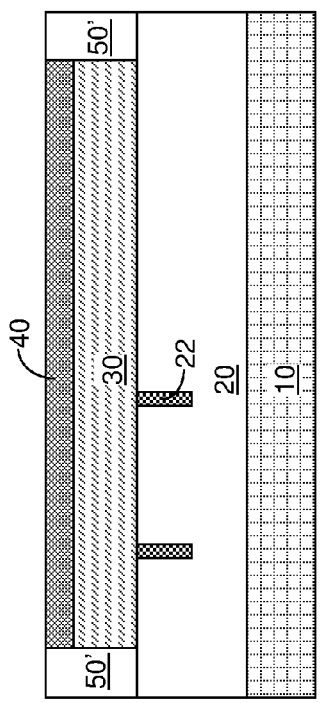
FIG. 5B is a vertical cross-sectional view of the exemplary semiconductor structure along the vertical plane B-B' of FIG. 5A.
Figure 5D:
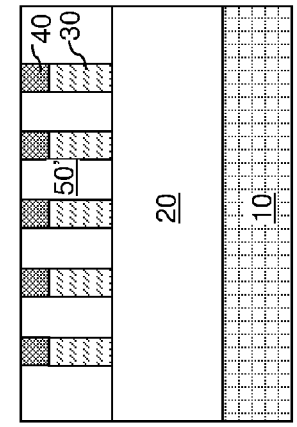
FIG. 5D is a vertical cross-sectional view of the exemplary semiconductor structure along the vertical plane D-D' of FIG. 5A.
Figure 6A:
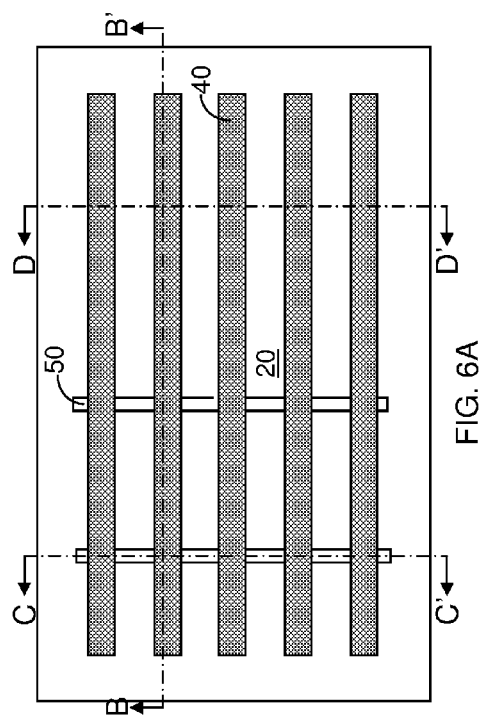
FIG. 6A is a top-down view of the exemplary semiconductor structure after recessing the planarization dielectric layer according to an embodiment of the present disclosure.
Figure 6C:
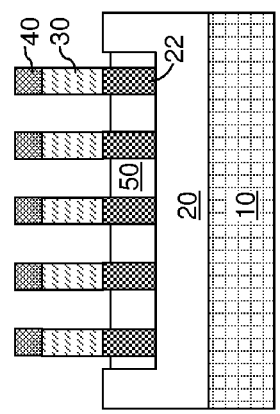
FIG. 6C is a vertical cross-sectional view of the exemplary semiconductor structure along the vertical plane C-C' of FIG. 6A
Figure 6B:
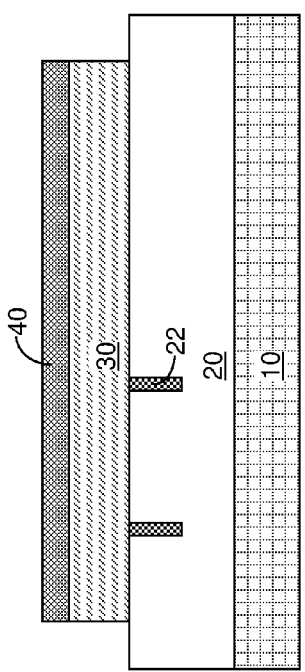
FIG. 6B is a vertical cross-sectional view of the exemplary semiconductor structure along the vertical plane B-B' of FIG. 6A.
Figure 6D:
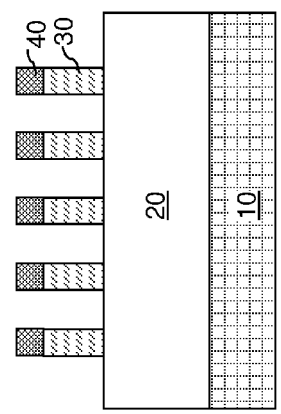
FIG. 6D is a vertical cross-sectional view of the exemplary semiconductor structure along the vertical plane D-D' of FIG. 6A.
Figure 7C:
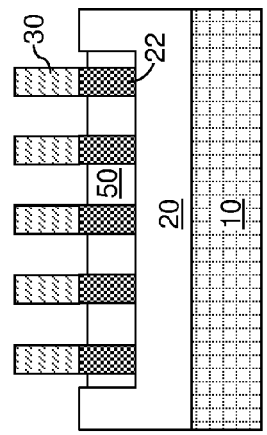
FIG. 7C is a vertical cross-sectional view of the exemplary semiconductor structure along the vertical plane C-C' of FIG. 7A.
Figure 7D:
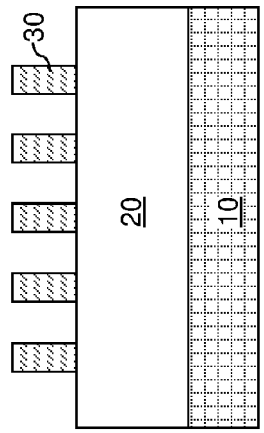
FIG. 7D is a vertical cross-sectional view of the exemplary semiconductor structure along the vertical plane D-D' of FIG. 7A.
Figure 7A:
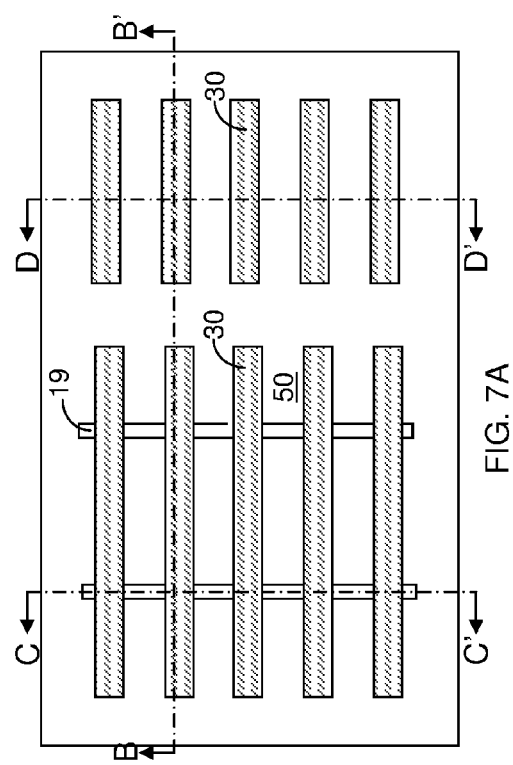
FIG. 7A is a top-down view of the exemplary semiconductor structure after cutting the semiconductor fins and removal of fin cap portions according to an embodiment of the present disclosure.
Figure 7B:
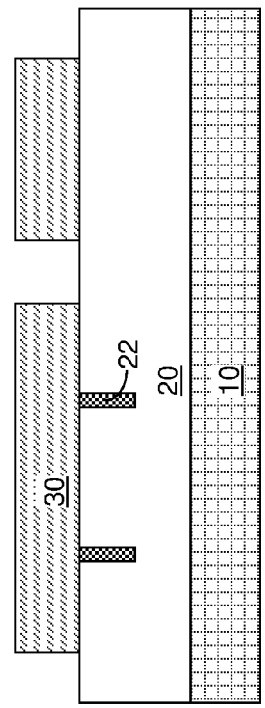
FIG. 7B is a vertical cross-sectional view of the exemplary semiconductor structure along the vertical plane B-B' of FIG. 7A.
Figure 8A:
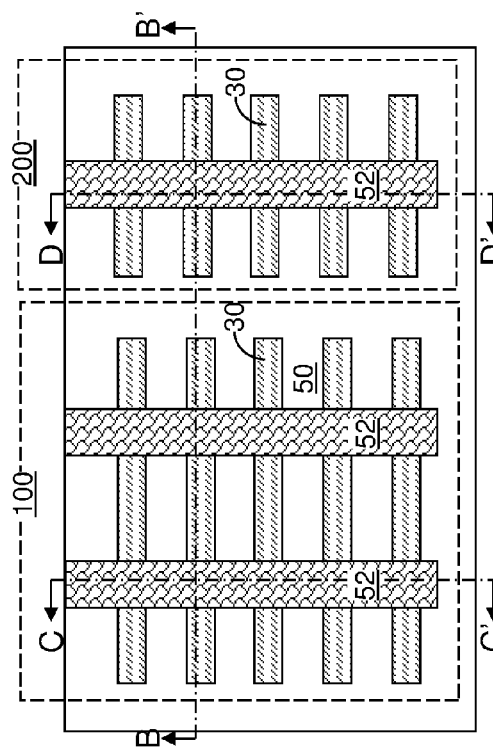
FIG. 8A is a top-down view of the exemplary semiconductor structure after formation of gate structures according to an embodiment of the present disclosure.
Figure 8B:
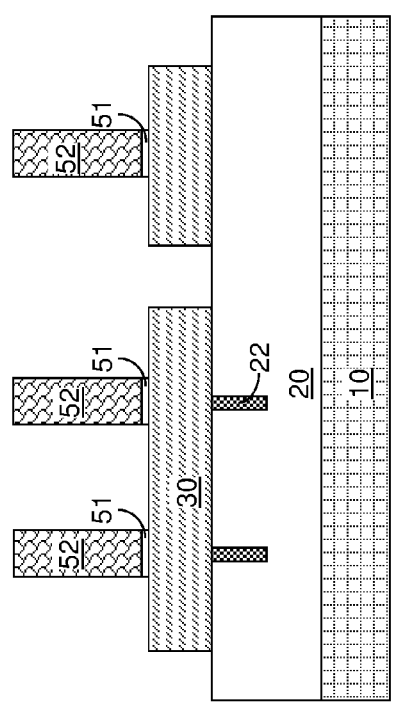
FIG. 8B is a vertical cross-sectional view of the exemplary semiconductor structure along the vertical plane B-B' of FIG. 8A.
Figure 8C:
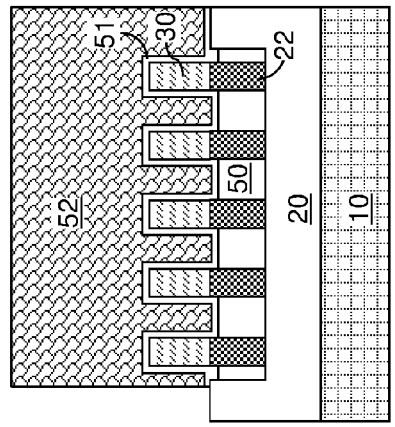
FIG. 8C is a vertical cross-sectional view of the exemplary semiconductor structure along the vertical plane C-C' of FIG. 8A.
Figure 8D:
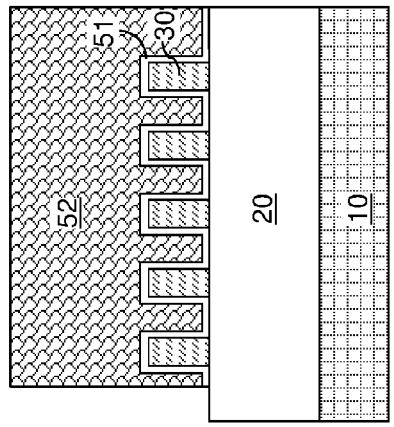
FIG. 8D is a vertical cross-sectional view of the exemplary semiconductor structure along the vertical plane D-D' of FIG. 8A.
Figure 10A:
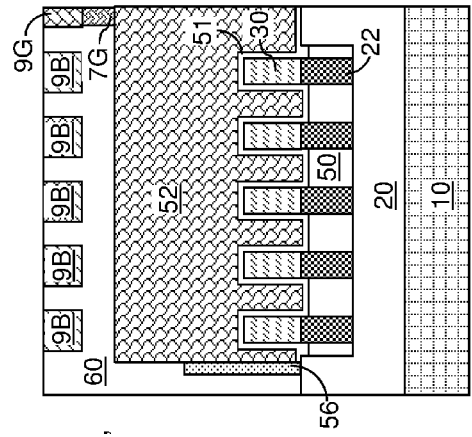
FIG. 10A is a top-down view of the exemplary semiconductor structure after formation at least one dielectric material layer, source interconnect lines, contact via structures, and interconnect level line structures according to an embodiment of the present disclosure.
Figure 10C:
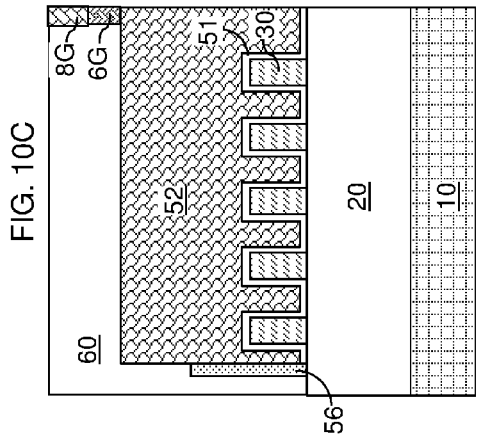
FIG. 10C is a vertical cross-sectional view of the exemplary semiconductor structure along the vertical plane C-C' of FIG. 10A.
Figure 10B:
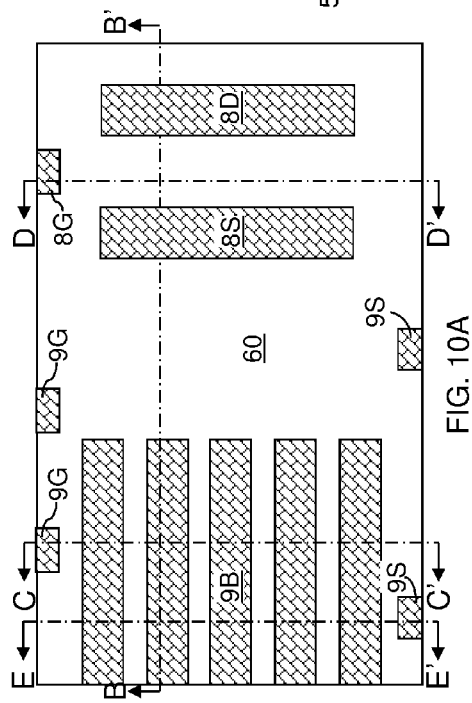
FIG. 10B is a vertical cross-sectional view of the exemplary semiconductor structure along the vertical plane B-B' of FIG. 10A.
Figure 10D:
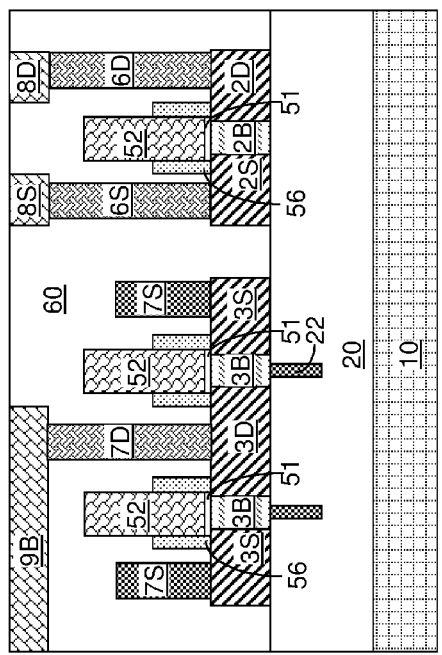
FIG. 10D is a vertical cross-sectional view of the exemplary semiconductor structure along the vertical plane D-D' of FIG. 10A.
Figure 10E:
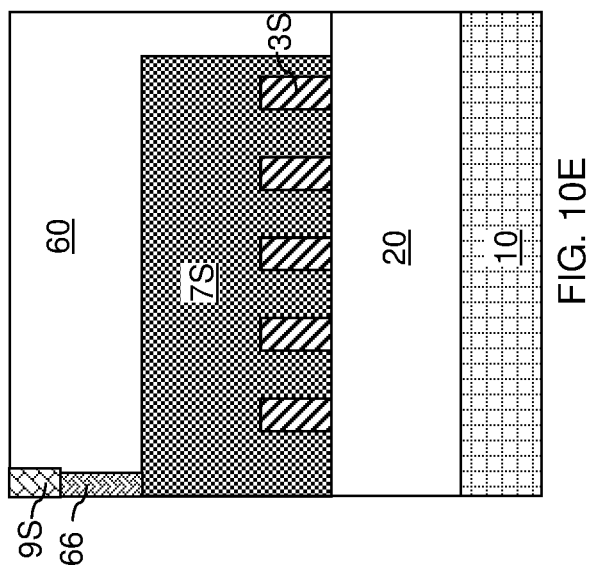
FIG. 10E is a vertical cross-sectional view of the exemplary semiconductor structure along the vertical plane E-E' of FIG. 10A.

Referring to FIGS. 3A-3C, a semiconductor material layer 30L is bonded to the top surface of the dielectric material layer 20. The semiconductor material layer 30L includes a semiconductor material, which can be an elemental semiconductor material, an alloy of elemental semiconductor materials, a compound semiconductor material, or an organic semiconductor material. In one embodiment, the semiconductor material layer 30L can include a single crystalline semiconductor material. In one embodiment, the semiconductor material layer 30L can be a single crystalline semiconductor material layer including silicon, a silicon-containing semiconductor material, or a germanium-containing semiconductor material. In one embodiment, the semiconductor material layer 30L can include single crystalline silicon. The thickness of the semiconductor material layer 30L can be in a range from 10 nm to 200 nm, although lesser and greater thicknesses can also be employed.

The boding of the semiconductor material layer 30L to the dielectric material layer 20 can be performed employing methods known in the art. For example, a semiconductor substrate including a hydrogen layer can be bonded to the top surface of the dielectric material layer 20 at an elevated temperature, and the semiconductor substrate can be cleaved at the hydrogen layer such that the remaining bonded semiconductor material portion constitutes the semiconductor material layer 30L.

Referring to FIGS. 4A-4D, a hard mask layer can be optionally deposited as a blanket material layer over the top surface of the semiconductor material layer 30L. The hard mask layer can include a dielectric material such as silicon nitride, or can include a metallic material such as a metallic nitride. As used herein, a blanket material layer refers to an unpatterned material layer, i.e., a material layer that does not include any pattern. The hard mask layer can be deposited, for example, by chemical vapor deposition (CVD) or by physical vapor deposition (PVD). The thickness of the hard mask layer can be in a range from 3 nm to 60 nm, although lesser and greater thicknesses can also be employed.

The hard mask layer can be patterned by a combination of lithographic methods and an etch. For example, a photoresist layer (not shown) can be applied over the hard mask layer and lithographically patterned to include a pattern of stripes straddling the conductive material portions 22. In one embodiment, the direction of the stripes in the pattern can be perpendicular to the lengthwise direction of the conductive material portions 22. In one embodiment, the shapes of the stripes can be rectangular. In one embodiment, the shapes of the stripes can have a uniform width and a uniform spacing such that the stripes form a one-dimensional periodic array of a two-dimensional periodic array. The pattern in the photoresist layer is subsequently transferred into the hard mask layer by an etch, which can be an anisotropic etch. The hard mask layer is patterned such that the pattern in the photoresist layer is duplicated in the hard mask layer, for example, by an anisotropic etch. Upon patterning, the hard mask layer is divided into multiple portions, which are herein referred to as fin cap portions 40. The photoresist layer may be subsequently removed, for example, by ashing.

The semiconductor material layer 30L can be patterned by an anisotropic etch that employs the fin cap portions 40 and/or the photoresist layer, if the photoresist layer is not previously removed. The remaining portions of the semiconductor material layer 30L constitute semiconductor fins 30. Each semiconductor fin 30 includes a pair of parallel vertical sidewalls that extend along the lengthwise direction of the semiconductor fin 30. In one embodiment, each semiconductor fin 30 can have a shape of a rectangular parallelepiped. As used herein, the "lengthwise direction" of a semiconductor fin refers to the direction along which the moment of inertia of the semiconductor fin around the center of mass of the semiconductor fin is minimized. In one embodiment, the lengthwise direction of each semiconductor fin 30 can be perpendicular to the lengthwise directions of the conductive material portions 22.

Subsequently, physically exposed portions of the conductive material portions 22 can be etched employing the fin cap portions 40 and/or the photoresist layer, if the photoresist layer is not previously removed, as an etch mask. Thus, the trench fill material can be removed by an anisotropic etch in areas that do not underlie the semiconductor fins 30. Within each trench (as formed at the processing steps of FIGS. 1A-1C), the remaining portions of the conductive material portions 22 can be laterally isolated from one another. Thus, after the anisotropic etch, each conductive material portion 22 can have a pair of sidewalls that are vertically coincident with the lengthwise sidewalls of an overlying semiconductor fin 30, and extending from the bottom surface of the overlying semiconductor fin 30 to the bottommost surface of the trench 19. Each conductive material portion 22 can have the same width as the overlying semiconductor fin 30 along the horizontal direction perpendicular to the lengthwise direction of the overlying semiconductor fin 30. Each semiconductor fin 30 can overlie a plurality of conductive material portions 22.

In one embodiment, each remaining portion of the conductive material underneath the semiconductor fins 30 can constitute a conductive material portion 22 having a rectangular horizontal cross-sectional area. Each conductive material portion 22 can be in physical contact with surfaces of the dielectric material layer 20. Sidewalls of each conductive material portion 22 can be vertically coincident with a pair of parallel sidewalls of the overlying semiconductor fin 30.

A cavity is formed between each neighboring pair of semiconductor fins 30 within each trench 19 by the anisotropic etch. Each trench 19 can include a pair of parallel vertical sidewalls, i.e., a pair of lengthwise sidewalls, laterally extending further than the width of an overlying semiconductor fin 30.

Referring to FIGS. 5A-5D, a planarization dielectric layer 50' is formed in the cavities of the trenches 19 and around the semiconductor fins 30 and the fin cap portions 40. The planarization dielectric layer 50' includes a planarizable dielectric material such as an undoped silicate glass or a doped silicate glass. The planarization dielectric layer 50' can be deposited by chemical vapor deposition (CVD) or by spin-on coating. In one embodiment, the planarization dielectric layer 50' can be self-planarizing. In another embodiment, the planarization dielectric layer 50' can be planarized, for example, by chemical mechanical planarization (CMP) employing the fin cap portions 40 as a stopping layer.

Each cavity between a neighboring pair of conductive material portions 22 is filled with the dielectric material of the planarization dielectric layer 50'. The dielectric material of the planarization dielectric layer 50' can be deposited directly on the sidewalls of the conductive material portions 22 and the sidewalls of the dielectric material layer 20 around each cavity in the trenches that include the conductive material portions 22.

Referring to FIGS. 6A-6D, the planarization dielectric layer 50' is recessed employing a recess etch, which can be an isotropic etch or an anisotropic etch. The planarization dielectric layer 50' is recessed selective to the fin cap portions 40 and the semiconductor fins 30'. If the planarization dielectric layer 50' includes an undoped silicate glass or a doped silicate glass, the planarization dielectric layer 50' can be recessed by a wet etch employing hydrofluoric acid, or by a dry etch employing HF as an etchant vapor. In one embodiment, the top surface of the remaining portions of the planarization dielectric layer 50' may be recessed below the top surface of the dielectric material layer 20. The remaining portions of the planarization dielectric layer 50' after the recess process constitute dielectric material portions 50. Each dielectric material portion 50 contacts sidewalls of the dielectric material layer 20 and at least one sidewall of the conductive material portions 22. The top surface of each dielectric material portion 50 may be coplanar with, or may be recessed below, the top surface of the dielectric material layer 20. In one embodiment, each cavity underlying the semiconductor fins 30 can be filled with at least one conductive material portion 22 and at least one dielectric material portion 50. A dielectric material portion 50 can be formed directly on at least one conductive material portion 22 and directly on the sidewalls of the dielectric material layer 20.

Referring to FIGS. 7A-7D, the semiconductor fins 30 may be optionally cut into smaller semiconductor fins 30 by a combination of lithographic methods and an anisotropic etch. For example, a photoresist layer (not shown) may be applied over the fin cap portions 40, and is lithographically patterned to remove portions corresponding to the area from which removal of the semiconductor fins 30 is desired. Portions of the fin cap portions 40 and the semiconductor fins 30 that are not protected by remaining portions of the photoresist layer can be removed, for example, by an anisotropic etch. The photoresist layer can be subsequently removed, for example, by ashing.

The fin cap portions 40 can be removed selective to the semiconductor fins 40, the dielectric material layer 20, and the dielectric material portions 50. In one embodiment, the removal of the fin cap portions 40 can be performed by a wet etch. For example, if the fin cap portions 40 include silicon nitride, the removal of the fin cap portions 40 can be performed by a wet etch employing hot phosphoric acid.

Referring to FIGS. 8A-8D, gate structures (51, 52) are formed across the semiconductor fins 30. Each gate structure (51, 52) includes a stack of a gate dielectric 51 and a gate electrode 52. The gate structures (51, 52) can be formed by deposition of a gate dielectric layer and a gate conductor layer, and by patterning of the gate conductor layer and the gate dielectric layer by a combination of lithographic methods and an anisotropic etch. For example, a photoresist layer (not shown) can be applied over the gate conductor layer and can be lithographically patterned to cover regions straddling the semiconductor fins 30, and the portions of the gate conductor layer that are not covered by the patterned photoresist layer can be removed by an anisotropic etch. Subsequently, physically exposed portions of the gate dielectric layer can be removed by an isotropic etch or an anisotropic etch. Each remaining portion of the gate conductor layer constitutes a gate electrode 52, and each remaining portion of the gate dielectric layer constitutes a gate dielectric 51. Each gate structure (51, 52) can straddle at least one semiconductor fin 30.

Within the first device region, the gate structures (51, 52) can overlie the trenches including the conductive material portions 20 and the dielectric material portions 50. Thus, the top surfaces of the dielectric material portions 50 can be in contact with the bottom surfaces of the gate dielectrics 51. Further, sidewall surfaces of the conductive material portions 22 can be in contact with the sidewall surfaces of the gate dielectrics 51.

A gate spacer 56 can be formed around each gate structure (51, 52). The gate spacers 56 can be formed, for example, by deposition of a conformal dielectric material layer and by an anisotropic etch that removes horizontal portions of the conformal dielectric material layer. An overetch can be employed during the anisotropic etch to remove vertical portions of the conformal dielectric material layer from the sidewalls of the semiconductor fins 30 (See FIGS. 8A-8D) that are farther away from the outer sidewalls of the gate structures (51, 52) than the thickness of the conformal dielectric material layer. The conformal dielectric material layer includes a dielectric material such as silicon nitride. The thickness of the gate spacers 56 is the same as the thickness of the conformal dielectric material layer, and can be in a range from 5 nm to 100 nm, although lesser and greater thicknesses can also be employed.

Electrical dopants are introduced into portions of the semiconductor fins 30 (See FIGS. 8A-8D) that are not covered by the gate structures (51, 52) or by a combination of the gate structures (51, 52) and the gate spacers 56. Source regions (2S, 3S) and drain regions (2D, 3D) are formed in regions into which the electrical dopants are introduced. The formation of the source regions (2S, 3S) and the drain regions (2D, 3D) can be performed after formation of the gate spacers 56 and/or prior to formation of the gate spacers 56.

The electrical dopants can be p-type dopants or n-type dopants. Alternatively, p-type dopants can be introduced into a first subset of the semiconductor fins 30 to form p-doped source regions and p-doped drain regions, and n-type dopants can be introduced into a second subset of the semiconductor fins 30 to form n-doped source regions and n-doped drain regions. The introduction of the electrical dopants can be performed by ion implantation, plasma doping, outdiffusion of electrical dopants from at least one sacrificial doped silicate glass layers, and/or by deposition of a doped semiconductor material by a selective deposition (such as selective epitaxy) and outdiffusion of the electrical dopants from the deposited doped semiconductor material as known in the art.

The source regions (2S, 3S) include first type source regions 3S formed in the first device region 100 and second type source regions 2S formed in the second device region 200. The drain regions (2S, 3S) include first type drain regions 3D formed in the first device region 100 and second type drain regions 2D formed in the second device region 200. Portions into which the electrical dopants are not introduced constitute the body regions (2B, 3B). The body regions (2B, 3B) include first type body regions 3B that are formed in the first device region 100 and second type body regions 2B that are formed in the second device region 200.

Within the first device region 100, each physically contiguous combination of a first type source region 3S, a first type body region 3B, a first type drain region 3D, a conductive material portion 22, and a gate structure (51, 52) constitutes a field effect transistor with a variable threshold voltage. The variable threshold voltage is determined by electrical charges trapped within the combination of a body region 3B and an adjoining conductive material portion 22. Within the second device region 200, each physically contiguous combination of a second type source region 2S, a second type body region 2B, a second type drain region 2D, and a gate structure (51, 52) constitutes a field effect transistor.

Within the first device region 100, the gate structures (51, 52) are aligned with respect to the conductive material portions 22 such that the conductive material portions 22 contact an overlying first type body region 3B, and is not in physical contact or has minimal physical contact with any first type source region 3S or first type drain region 3D.

Each field effect transistor in the first device region 100 can be a fin field effect transistor including a semiconductor fin (3S, 3D, 3B) in which sidewalls of a conductive material portion 22 are vertically coincident with a pair of parallel sidewalls of the semiconductor fin (3S, 3D, 3B). A trench underlying the semiconductor fin (3S, 3D, 3B) includes a pair of parallel vertical sidewalls that laterally extends further than sidewalls of the body region 3B of the field effect transistor along a direction perpendicular to the lengthwise direction of the semiconductor fin (3S, 3D, 3B). At least one dielectric material portion 50 can be located in the trench underlying the semiconductor fin (3S, 3D, 3B), and can laterally contact the conductive material portion 22 underlying the semiconductor fin (3S, 3D, 3B) and located in the same trench.

In the first device region 100, each semiconductor fin (3S, 3D, 3B) can include a first type body region 3B, a first type source region 3S, and a first type drain region 3D. The conductive material portion 22 in contact with the first type body region 3B is not or minimally in physical contact with the first type source region 3S or the first type drain region 3D. In one embodiment, each conductive material portion 22 can have the same width as the overlying first type body region 3B. In one embodiment, sidewalls of each conductive material portion 22 can be vertically coincident with the pair of parallel sidewalls of an overlying semiconductor fin (3S, 3D, 3B).

In one embodiment, a plurality of conductive material portions 22 can be present in a same line trench. Each conductive material portion 22 in the same line trench can underlie different semiconductor fins (3S, 3D, 3B).

Referring to FIGS. 10A-10E, local interconnect structures 7S, source contact via structures 6S, drain contact via structures (6D, 7D), gate contact via structures (6G, 7G), and at least one dielectric material layer 60 can be formed. The local interconnect structures 7S can electrically short a plurality first type source regions 7S in the first device region, and can be employed to control the voltage of the first type source regions 3S. The source contact via structures 6S in the second device region controls the voltage at the second type source regions 2S. The drain contact via structures (6D, 7D) include first type contact via structures 7D that contact the first type drain regions 3D in the first device region, and second type contact via structures 6D that contact second type drain regions 2D in the second device region. The gate contact via structures (6G, 7G) can include first type gate contact via structures 7G contacting the gate electrodes 52 in the first device region, and second type gate contact via structures 6G contacting the gate electrodes 52 in the second device region. The at least one dielectric material layer 60 can be deposited prior to, during, and/or after formation of the local interconnect structures 7S, the source contact via structures 6S, the drain contact via structures (6D, 7D), and the gate contact via structures (6G, 7G).

In one embodiment, the local interconnect structures 7S can be conductive lines that are electrically shorted to first-type source regions 3S of the field effect transistors in the first device region, while the first type drain regions 3D of the field effect transistors in the first device region are electrically isolated from one another. As used herein, two elements are electrically isolated from each other if there exists a configuration in which no conductive path exists between the two elements.

Various interconnect level metal lines (8G, 8S, 8D, 9G, 9B) can be formed in, and/or on, the at least one dielectric layer 60 employing methods known in the art. The various interconnect level metal lines (8G, 8S, 8D, 9G, 9B) can include memory gate lines 9G, memory bit lines 9B, logic source lines 8S, logic drain lines 8D, and logic gate lines 8G. Additional interconnect level metal lines can be formed as needed.

The field effect transistors in the first device region can be employed as a memory device. For example, the field effect transistors in the first device region can be employed to store binary states. A first state among the binary states is a state in which majority carriers are stored in a combination of a first type body region 3B and a conductive material portion 22. To program the first state, the channel of the field effect transistor is turned on by applying a "high" voltage to the gate electrode 52 of the field effect transistor and by applying a "high" voltage to the first type drain region 3D through an appropriate first type contact via structures 7D and a memory bit line 9B. Impact ionization occurs at the first type drain region 3D, and the majority carriers are stored in the combination of the first type body region 3B and the conductive material portion 22.

A second state among the binary states is a state in which majority carriers are depleted in a combination of a first type body region 3B and a conductive material portion 22. To program the second state, the channel of the field effect transistor is turned on by applying a "high" voltage to the gate electrode 52 of the field effect transistor and by applying a "low" voltage to the first type drain region 3D through an appropriate first type contact via structures 7D and a memory bit line 9B. An inversion layer is formed in the channel region of the first type body region 3B, resulting in a flow of a large number of minority carriers into the channel region and a subsequent recombination with any remaining majority carriers in the first type body region 3B. Thus, the majority carriers are depleted in the combination of the first type body region 3B and the conductive material portion 22.

In order to hold the programmed binary state in the memory device, the voltage at the gate is held low, i.e., in a manner that repels the majority charge carriers away from the channel region and into the conductive material portion 22 in the trench underlying the first type body region 3B. Charge leakage in the field effect transistor in the first device region of the present disclosure can be lower than corresponding charge leakage a normal floating body field effect transistor that does not include an underlying conductive material portion because the electrical charges are primarily stored in the conductive material portion 22 that does not contact or minimally contact the first type source region 3S or the first type drain region 3D at a p-n junction.

In order to sense the programmed binary state in the memory device, the gate bias voltage of the field effect transistor is set at a value between a low threshold voltage and a high threshold voltage, while a "high" voltage is applied to the corresponding first type drain region 3D. If the transistor is in the first state, the transistor turns on under the applied bias conditions, and significant electrical current flows through a corresponding bit line. The current is detected, and the state of the field effect transistor is identified as the first state. If the transistor is in the second state, the transistor does not turn on under the applied bias conditions, and the electrical current through the corresponding bit line is insignificant. The state of the field effect transistor is identified as the second state. While an exemplary method to program, read, and erase the memory cell has been described herein, the memory structure can also be programmed, read, and/or erased employing other methods known in the art and compatible with the devices described herein.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure comprising:
    forming a trench in a dielectric material layer;
    filling the trench with a conductive material;
    forming a semiconductor fin on the dielectric material layer, the semiconductor fin overlapping a portion of the deposited conductive material;
    removing portions of the conductive material that do not underlie the semiconductor fin to provide a conductive material portion in the trench;
    forming a dielectric material portion in the trench to fill the trench; and
    forming a gate structure straddling a body region of the semiconductor fin, wherein a top surface of the conductive material portion is in physical contact with the body region of the semiconductor fin.

2. The method of claim 1, wherein the conductive material portion has a same width as the body region.

3. The method of claim 1, wherein the conductive material portion has a rectangular horizontal cross-sectional area.

4. The method of claim 1, wherein a pair of sidewalls of the conductive material portion are vertically coincident with a pair of sidewalls of the semiconductor fin.

5. The method of claim 1, where the dielectric material portion laterally contacts the conductive material portion and sidewalls of the trench.

6. The method of claim 1, wherein bottom surfaces of the conductive material portion and the dielectric material portion are in physical contact with a bottom surface of the trench.

7. The method of claim 1, wherein the trench extends along a first direction, and the semiconductor fin extends along a second direction perpendicular to the first direction.

8. The method of claim 1, wherein the forming the semiconductor fin comprises:
    forming a semiconductor material layer over a top surface of the dielectric material layer; and
    patterning the semiconductor material layer.

9. The method of claim 8, further comprising:
    forming a hard mask layer over a top surface of the semiconductor material layer prior to the patterning the semiconductor material layer; and
    patterning the hard mask layer to provide a fin cap portion, wherein the semiconductor material layer is patterned using the fin cap portion as an etch mask.

10. The method of claim 9, further comprising removing the fin cap portion prior to the forming the gate structure.

11. The method of claim 1, wherein the portions of the conductive material that do not underlie the semiconductor fin are removed by an anisotropic etch.

12. The method of claim 11, wherein a cavity is formed in the trench by the anisotropic etch.

13. The method of claim 12, further comprising filling the cavity with the dielectric material portion.

14. The method of claim 1, wherein the forming the dielectric material portion comprises:
    forming a planarization dielectric layer within the trench and over the dielectric material layer, wherein the planarization dielectric layer laterally surrounds the semiconductor fin; and
    recessing the planarization dielectric layer to provide the dielectric material portion.

15. The method of claim 1, wherein a top surface of the dielectric material portion is coplanar with a top surface of the dielectric material layer.

16. The method of claim 1, wherein a top surface of the dielectric material portion is located below a top surface of the dielectric material layer.

17. The method of claim 1, wherein the gate structure comprising a gate dielectric and a gate electrode, wherein the gate dielectric is in contact with a top surface of the dielectric material portion, and sidewall surfaces of the conductive material portion.

18. The method of claim 1, further comprising forming a source region and a drain region in said semiconductor fin, wherein the source region and the drain region are located on opposite sides of the body region, and the conductive material portion is not in physical contact with the source region or the drain region.

19. The method of claim 1, further comprising:
    forming another conductive material portion in the trench, wherein the another conductive material portion is electrically insulated from the conductive material portion by the dielectric material portion, and wherein the semiconductor fin overlies the another conductive material portion;
    forming another gate structure straddling another body region of the semiconductor fin, wherein a top surface of the another conductive material portion is in physical contact with the another body region of the semiconductor fin; and
    a conductive line electrically shorted to a source region having a first side contacted by the body portion of the semiconductor fin and a second side contacted by the another body portion of the semiconductor fin.

20. The method of claim 1, further comprising cutting the semiconductor fin to form another semiconductor fin, wherein the another semiconductor fin does not overlie the trench.

* * * * *